United States Patent
Kwak et al.

(10) Patent No.: US 8,838,885 B2
(45) Date of Patent: Sep. 16, 2014

(54) SOLID STATE DRIVE PACKAGES AND RELATED METHODS AND SYSTEMS

(75) Inventors: Dong-ok Kwak, Suwon-si (KR); Sang-sub Song, Suwon-si (KR); Sang-ho An, Suwon-si (KR); Joon-young Oh, Seongnam-si (KR); Jeong-sik Yoo, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 188 days.

(21) Appl. No.: 13/490,865

(22) Filed: Jun. 7, 2012

(65) Prior Publication Data

US 2012/0317332 A1    Dec. 13, 2012

(30) Foreign Application Priority Data

Jun. 10, 2011  (KR) ......... 10-2011-0056339

(51) Int. Cl.
    *H01L 23/48* (2006.01)
    *G06F 12/02* (2006.01)
(52) U.S. Cl.
    CPC ... *G06F 12/0246* (2013.01); *H01L 2225/06562* (2013.01); *H01L 2224/48091* (2013.01); *H01L 2224/48227* (2013.01); *H01L 2224/73265* (2013.01); *H01L 2224/48145* (2013.01)
    USPC ............ 711/103; 711/102; 257/678
(58) Field of Classification Search
    CPC ......... H01L 2224/73265; H01L 2224/48227; H01L 2224/32145; H01L 2924/15311; H01L 2224/48145; H01L 2225/06562; H01L 2225/06528; G06F 3/0688; G06F 3/0644; G06F 2212/7206; G06F 3/0608; G06F 3/061; G06F 3/0614; G06F 3/0665
    USPC ................................ 711/103, 102; 257/678
    See application file for complete search history.

(56) References Cited

U.S. PATENT DOCUMENTS

| | | | |
|---|---|---|---|
| 8,228,728 B1 * | 7/2012 | Yang et al. | 365/185.03 |
| 2010/0061056 A1 * | 3/2010 | Searls et al. | 361/679.56 |
| 2010/0131701 A1 * | 5/2010 | Fujiwara | 711/103 |
| 2010/0318718 A1 * | 12/2010 | Eilert et al. | 711/103 |
| 2012/0059978 A1 * | 3/2012 | Rosenband et al. | 711/103 |

FOREIGN PATENT DOCUMENTS

| | | |
|---|---|---|
| KR | 1020080090268 A | 10/2008 |
| KR | 1020100026392 A | 3/2010 |
| KR | 1020100071522 A | 6/2010 |

* cited by examiner

*Primary Examiner* — Hashem Farrokh
(74) *Attorney, Agent, or Firm* — Myers Bigel Sibley & Sajovec

(57) ABSTRACT

Solid state drive (SSD) packages are provided including a controller package and at least one non-volatile memory package. The controller package and the at least one non-volatile memory package are connected to each other using a package-on-package (PoP) technique. A data input/output of the at least one non-volatile memory package is controlled by using the controller package.

18 Claims, 16 Drawing Sheets

US 8,838,885 B2

SOLID STATE DRIVE PACKAGES AND RELATED METHODS AND SYSTEMS

CLAIM OF PRIORITY

This application claims priority to Korean Patent Application No. 10-2011-0056339, filed Jun. 10, 2011, the disclosure of which is hereby incorporated herein by reference as if set forth in its entirety.

FIELD

The present inventive concept relates generally to semiconductor devices and, more particularly, to solid state drive packages and related systems and methods of manufacturing the same.

BACKGROUND

Solid state drives are being noticed as next-generation storage devices to replace conventional hard disk drives. The solid state drives, which are storage devices based on a non-volatile memory, have low power consumption and a high storage density. Moreover, when using the solid state drives as a storage device of a computer system, the computer system may be configured to boot faster than a conventional device, and thus, a demand for such computer systems is expected to increase significantly.

SUMMARY

Some embodiments of the present inventive concept provide a solid state drive (SSD) package comprising a controller package and at least one non-volatile memory package, wherein the controller package and the at least one non-volatile memory package are connected to each other using a package-on-package (PoP) technique, and a data input/output of the at least one non-volatile memory package is controlled by using the controller package.

In further embodiments, the controller package may include an SSD controller chip. The SSD controller chip may include a program that transmits or receives a signal to or from an external device according to the Serial Advanced Technology Attachment (SATA) standard.

In still further embodiments, the at least one non-volatile memory package may be disposed on the controller package. The controller package may further include a first substrate on which the SSD controller chip is mounted. The at least one non-volatile memory package disposed on the controller package may be connected to the first substrate via a connection terminal. There may be a space between at least a portion of an upper surface of the controller package and the non-volatile memory package.

In some embodiments, the controller package may further include an auxiliary memory unit. The controller package may communicate with an external system via the auxiliary memory unit. The auxiliary memory unit may be disposed at substantially the same height as the SSD controller chip and be connected to the non-volatile memory package using a PoP technique. The auxiliary memory unit may include a dynamic random access memory (DRAM).

In further embodiments, the SSD package may further include a passive device mounted on the first substrate, wherein the passive device is electrically connected to the SSD controller chip.

In still further embodiments, the non-volatile memory package may be connected to the first substrate via a through connection terminal (TCT). The first substrate may be connected to an external device via a conductive bump.

In some embodiments, the SSD controller chip may include an auxiliary memory unit. The auxiliary memory unit may include a dynamic random access memory (DRAM).

In further embodiments, the SSD package may further include a heat sink formed on the non-volatile memory package.

In still further embodiments, the controller package may be disposed on the at least one non-volatile memory package. The non-volatile memory package may include a non-volatile memory chip and a second substrate on which the non-volatile memory chip is mounted, and the controller package disposed on the non-volatile memory package may be connected to the second substrate via a connection terminal. The second substrate may be connected to an external device via a conductive bump. The SSD package may further include a heat sink on the controller package.

Some embodiments of the present inventive concept provide a data storage system including a main board; an SSD package mounted on the main board; and an input/output terminal that is electrically connected to the SSD package via the main board and forms an interface between the SSD package and an external device. The SSD package may be mounted on the main board via a conductive bump.

Further embodiments of the present inventive concept include a main board; a central processing unit mounted on the main board; an SSD package mounted on the main board and configured to communicate with the central processing unit using the SATA standard; an input unit for inputting data to the central processing unit; and an output unit for outputting data from the central processing unit. The SSD package may be mounted on the main board via a conductive bump.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
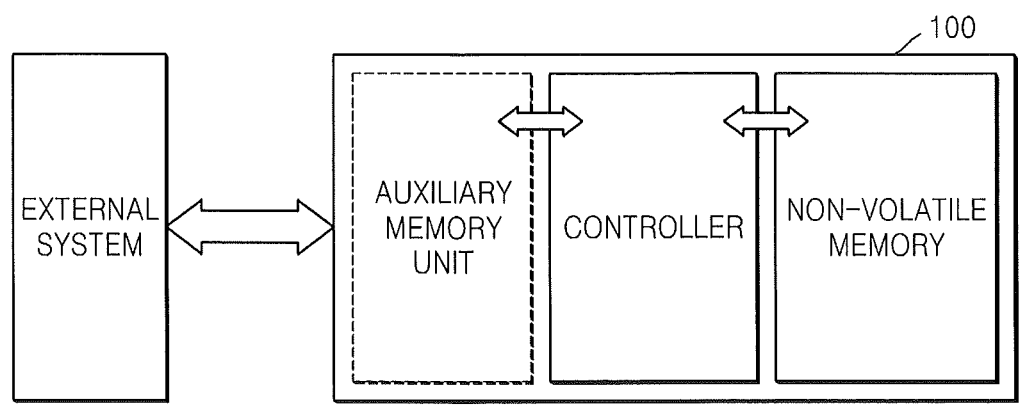
FIG. 1 is a block diagram illustrating a relationship between main components of a solid state drive (SSD) package and an external system according to some embodiments of the present inventive concept.

The inventive concept will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals denote like elements. Furthermore, various elements and regions illustrated in the drawings are schematically illustrated. Thus, the inventive concept is not limited by the relative sizes or intervals illustrated in the attached drawings.

In the present description, terms such as 'first', 'second', etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the scope of the right of the inventive concept.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/". As used herein, dotted lines depict optional features in a figure.

The terms used in the present specification are merely used to describe exemplary embodiments, and are not intended to limit the inventive concept. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Embodiments of the inventive concept may be described with reference to cross-sectional illustrations, which are schematic illustrations of idealized embodiments of the present inventive concept. As such, variations from the shapes of the illustrations, as a result, for example, of manufacturing techniques and/or tolerances, are to be expected. Thus, embodiments of the present inventive concept should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present inventive concept.

Unless defined differently, all terms used in the description including technical and scientific terms have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

As will be discussed further herein, some embodiments of the inventive concept provide solid state drive (SSD) packages having excellent thermal characteristics, increased reliability, and a small footprint and may, therefore, provide advantages for forming compact storage devices. Related data storage systems including an SSD package and systems including an SSD package are also discussed herein.

Referring first to FIG. 1, a block diagram illustrating a relationship between main components of a solid state drive (SSD) package 100 and an external system according to some embodiments of the present inventive concept will be discussed. As illustrated in FIG. 1, the SSD package 100 may include a non-volatile memory unit that stores data and a controller unit that controls input and output of data to and from the non-volatile memory unit. Optionally (as indicated by the dotted lines), the SSD package 100 may further include an auxiliary memory unit that buffers a difference in data transmitting speeds and data reading/storage speeds between the controller unit and the non-volatile memory unit and the external system.

As further illustrated in FIG. 1, data input from the external system may pass the auxiliary memory unit and the controller unit to be stored in the non-volatile memory unit. In addition, the controller unit may read data from the non-volatile memory unit and transmit the data to the external system via the auxiliary memory unit.

Figure 2:
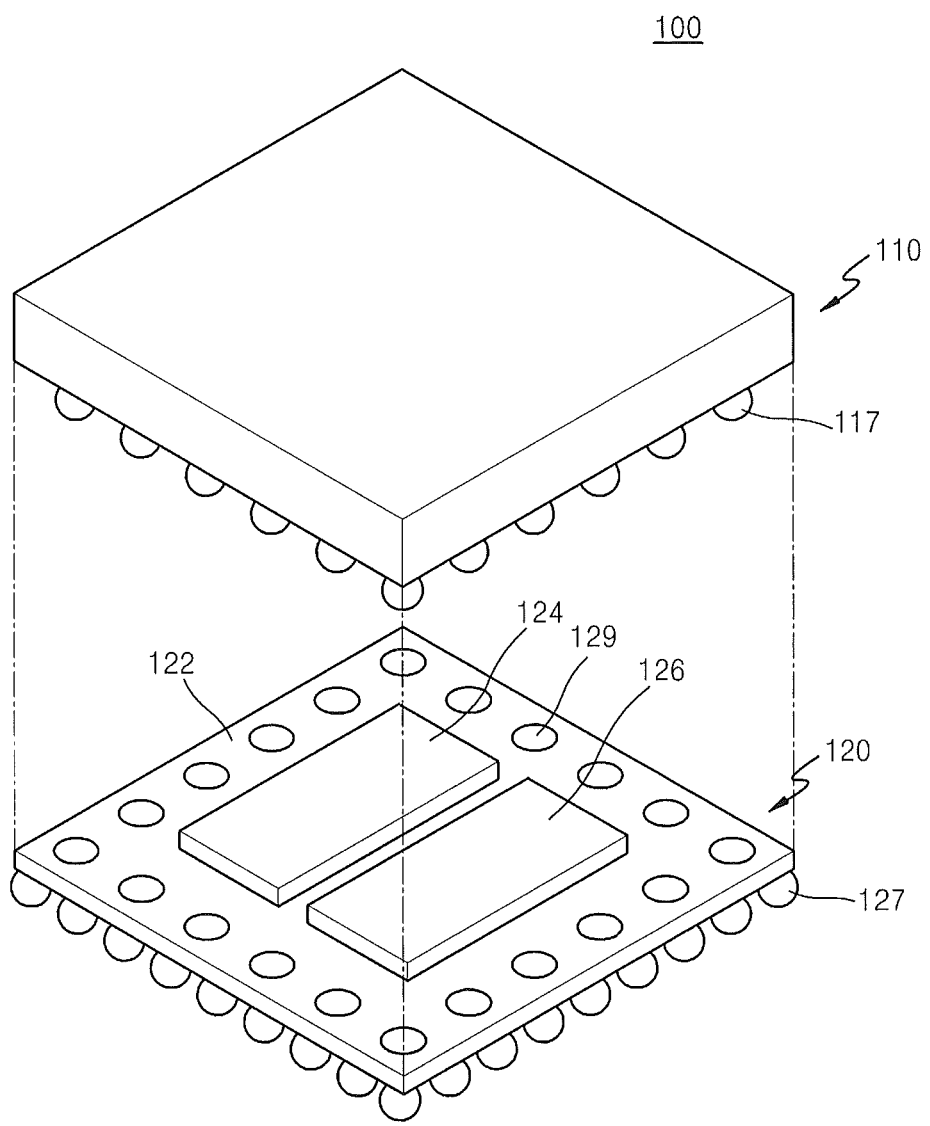
FIG. 2 is an exploded perspective view illustrating an SSD package according to some embodiments of the inventive concept.

Referring now to FIG. 2, a more detailed exploded view illustrating an SSD package 100 according to some embodiments will be discussed. As illustrated in FIG. 2, the SSD package 100 includes a controller package 120 and a non-volatile memory package 110 that are stacked on each other. While the non-volatile memory package 110 is stacked on the controller package 120 in a package-on-package (PoP) manner in FIG. 2, embodiments of the present inventive concept are not limited to this configuration. For example, the controller package 120 may be disposed on the non-volatile memory package 110, as described below, without departing from the scope of the present inventive concept.

As further illustrated in FIG. 2, the controller package 120 may be a package in which an SSD controller chip 124 is mounted on a first substrate 122. The first substrate 122 may be, for example, a printed circuit board, a flexible printed circuit board, or a tape substrate. The first substrate 122 may include, for example, a core board 122a, as discussed below with respect to FIG. 5, having an upper surface and a lower surface on which a first resin layer 122b (FIG. 5) and a second resin layer 122c (FIG. 5) may be formed, respectively. Furthermore, the first resin layer 122b (FIG. 5) and/or the second resin layer 122c (FIG. 5) may have a multi-layer structure, and a signal layer, a ground layer, or a power layer may be interposed between layers of the multi-layer structure as wiring patterns. Furthermore, conductive wiring patterns may be formed on the first resin layer 122b (FIG. 5) and/or the second resin layer 122c (FIG. 5).

The SSD controller chip 124 may include a program which is capable of transmitting or receiving a signal to or from an external device according to the Serial Advanced Technology Attachment (SATA) standard, Parallel Advanced Technology Attachment (PATA) standard, or Small Computer System Interface (SCSI) standard. The SATA standard includes all SATA standards, not only SATA-1 but also SATA-2, SATA-3, and external SATA (e-SATA). The PATA standard includes all integrated drive electronics (IDE) standards such as IDE or enhanced-IDE (E-IDE). The present specification incorporates the Serial ATA Revision 2.6, which was published by the Serial ATA International Organization on Feb. 15, 2007 in its entirety by reference.

Furthermore, the SSD controller chip 124 may perform functions such as wear leveling, error correction, and/or fail block control. Optionally, an additional auxiliary controller chip configured to perform the functions such as wear leveling, error correction, and/or fail block control, may be provided. The auxiliary controller chip may be formed on the first substrate 122. Alternatively, the auxiliary controller chip may be formed on a second substrate 210, 310, 410, or 510 as discussed below with respect to FIGS. 3A through 3C and FIG. 10.

The SSD controller chip 124 may be mounted on the first substrate 122 using a method such as, for example, a ball grid array (BGA) method, a pin grid array (PGA) method, a tape carrier package (TCP) method, a chip-on-board (COB) method, a quad flat non-leaded (QFN) method, or a quad flat package (QFP) method, but is not limited thereto.

The controller package 120 may further include an auxiliary memory unit 126. The auxiliary memory unit 126 may be a dynamic random access memory (DRAM). As described above, the DRAM may function as a buffer for data exchange between the SSD controller chip 124 and the non-volatile memory package 110, which is described below and the external system. The auxiliary memory unit 126 may also be mounted on the first substrate 122 using a BGA method, a PGA method, a TCP method, a COB method, a QFN method, or a QFP method, but is not limited thereto.

While the auxiliary memory unit 126 is separately disposed on the first substrate 122 in FIG. 2, the auxiliary memory unit 126 may also be mounted in the SSD controller chip 124. In other words, an auxiliary memory unit that functions as a buffer when communicating with an external system may be embedded in the SSD controller chip 124. In some embodiments, the auxiliary memory unit may be a DRAM.

Referring again to FIG. 2, the first substrate 122 may include a plurality of substrate pads 129, which may be connected to an external device. Pads disposed under the first substrate 122 may be electrically connected to an external device via connection terminals 127. The connection terminals 127 may be, for example, a conductive bump such as a solder ball, a pin, or a lead line, but the connection terminals 127 are not limited thereto.

The non-volatile memory package 110 includes a non-volatile memory and is integrated to the controller package 120 using a PoP technique. Examples of the non-volatile memory include a flash memory, phase-change RAM (PRAM), a resistive RAM (RRAM), a ferroelectric RAM (FeRAM), a magnetic RAM (MRAM), but are not limited thereto. The flash memory may be, for example, a NAND flash memory.

The non-volatile memory may be formed of a single semiconductor chip or a plurality of stacked semiconductor chips without departing from the scope of the present inventive concept.

Figure 3A:
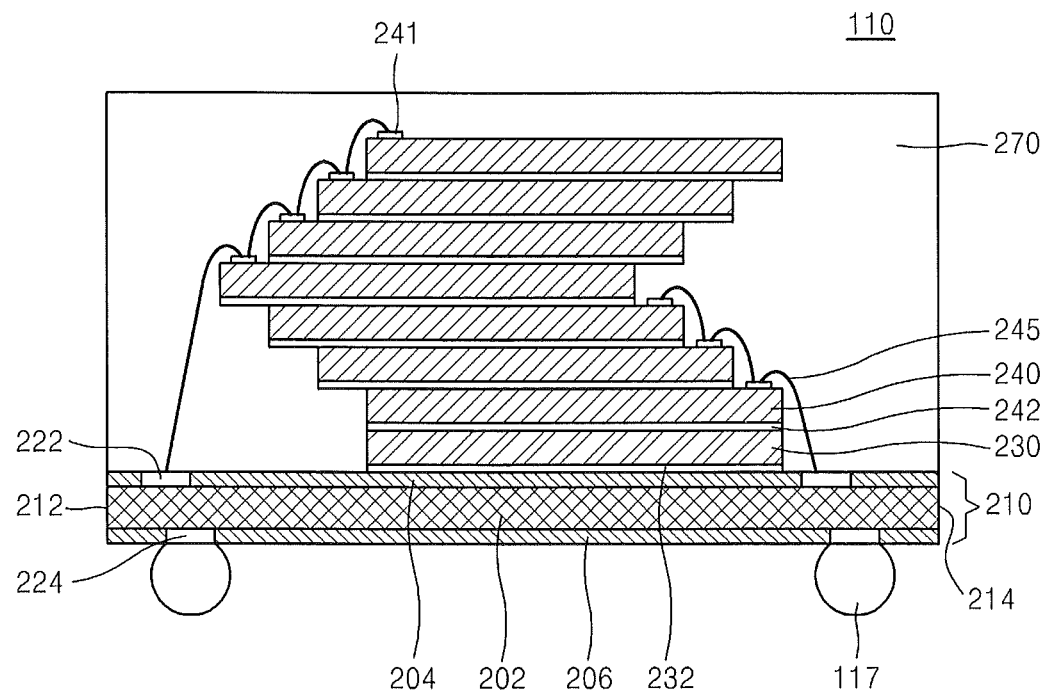
FIGS. 3A through 3D are cross sections illustrating stacking non-volatile memories in non-volatile memory packages according to some embodiments of the inventive concept.

Referring now to FIGS. 3A through 3D, cross sections of stacking non-volatile memories in non-volatile memory packages 110 according to some embodiments of the present inventive concept will be discussed. As illustrated in FIG. 3A, the non-volatile memory package 110 may include the second substrate 210 and semiconductor chips 240 stacked on the second substrate 210.

The second substrate 210 may be, for example, a printed circuit board, a flexible printed circuit board, or a tape substrate. The second substrate 210 may include, for example, a core board 202 having an upper surface and a lower surface on which a first resin layer 204 and a second resin layer 206 may be formed, respectively. Furthermore, the first resin layer 204 and/or the second resin layer 206 may have a multi-layer structure. A signal layer, a ground layer, or a power layer may be interposed between layers of the multi-layer structure as wiring patterns. Furthermore, conductive wiring patterns (not shown) may be formed on the first resin layer 204 and/or the second resin layer 206. The second substrate 210 may include a first sidewall 212 and a second sidewall 214 that are disposed on opposite sides.

The semiconductor chips 240 may be stacked on the second substrate 210 using an adhesive member 242. The semiconductor chips 240 may be stacked in an offset chip-stacked structure as illustrated in FIG. 3A. The semiconductor chips 240 may each include an integrated circuit. For example, the integrated circuit may include a memory circuit or a logic circuit. The semiconductor chips 240 may include a plurality of electrode pads 241 that are formed on active surfaces thereof and connected to the integrated circuit therein.

The stacked semiconductor chips 240 may be homogenous chips or heterogeneous chips. For example, some of the semiconductor chips 240 may be memory chips, and the rest may be non-memory chips. Alternatively, all the semiconductor chips 240 may be memory chips. The memory chips 240 may include a flash memory, a PRAM, an RRAM, a FeRAM, or an MRAM without departing from the scope of the present inventive concept. The semiconductor chips 240 may have the same size or different sizes according to the type of a memory circuit. It will be understood that the number of illustrated semiconductor chips 240 is exemplary and is not limited thereto.

As discussed above, the semiconductor chips 240 may be sequentially offset such that the electrode pads 241 are exposed. For example, some of the semiconductor chips 240 that are disposed in a lower portion may be sequentially offset in a direction toward the first sidewall 212, and the rest of the semiconductor chips 240 disposed in an upper portion may be sequentially offset in a direction toward the second sidewall 214. The arrangement illustrated in FIG. 3A is exemplary and the inventive concept is not limited thereto. For example, the sequentially stacked semiconductor chips 240 may be alternately offset in directions toward the first sidewall 212 and the second sidewall 214.

The semiconductor chips 240 may be connected to one another using a connection member 245. Furthermore, the semiconductor chips 240 may be connected to a first substrate pad 222 of the second substrate 210 using the connection member 245. The connection member 245 may be, for example, a bonding wire. The connection member 245 may, for example, directly connect the first substrate pad 222 and the electrode pads 241 of the semiconductor chips 240 and also connect the electrode pads 241 of the semiconductor chips 240 to one another.

Furthermore, a supporting member 230 may be further provided between the second substrate 210 and the semiconductor chips 240. For example, the support member 230 may be interposed between the second substrate 210 and the lowermost semiconductor chip 240. The support member 230 may be attached on the second substrate 210 by using an adhesive member 232.

The support member 230 may support the semiconductor chips 240. The support member 230 may be electrically insulated from the second substrate 210. In addition, the support member 230 may be electrically insulated also from the semiconductor chips 240.

The non-volatile memory package 110 may be connected to another package via a connection terminal 117 in a PoP manner. The connection terminal 117 may be formed on a second substrate pad 224 provided in the second resin layer 206. Furthermore, the first substrate pad 222 and the second substrate pad 224 may be electrically connected to each other via a circuit included in the second substrate 210.

A molding member 270 may be formed over the second substrate 210 to encapsulate the semiconductor chips 240. For example, the molding member 270 may include an insulation resin such as an epoxy molding compound.

Figure 3B:
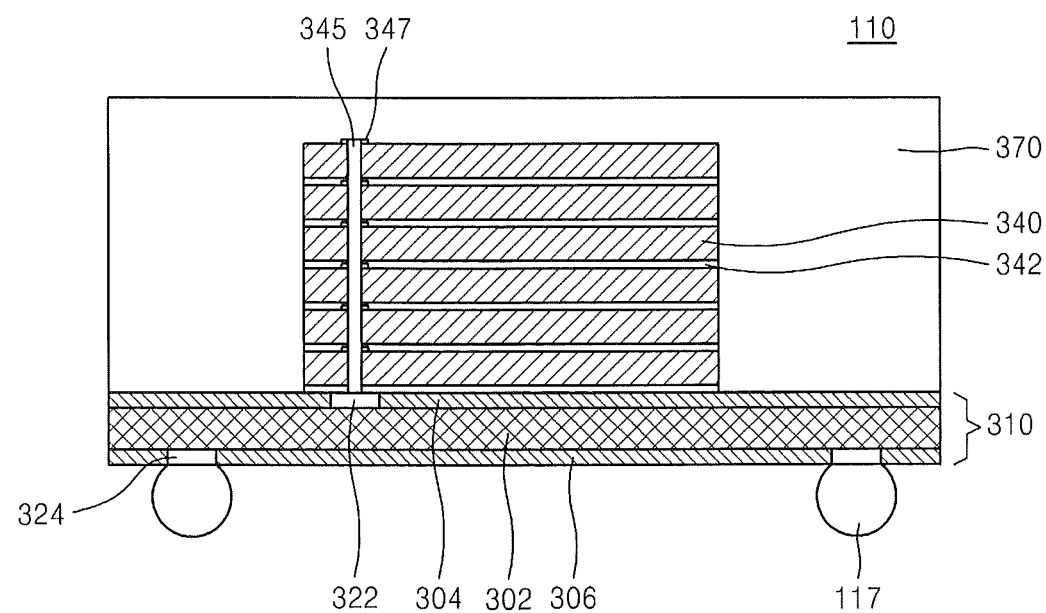

Referring to FIG. 3B, the non-volatile memory package 110 may include the second substrate 310 and semiconductor chips 340 stacked on the second substrate 310. The second substrate 310 may include a core board 302 having an upper surface and a lower surface on which a first resin layer 304 and a second resin layer 306 may be formed, respectively. Descriptions of the first resin layer 304, the core board 302, and the second resin layer 306 are not repeated because they are the same as those of the embodiment of FIG. 3A.

The semiconductor chips 340 may be stacked on the second substrate 310 with adhesive members 342 interposed therebetween. Unlike the embodiment of FIG. 3A, the semiconductor chips 340 may be stacked without being offset. The semiconductor chips 340 may be electrically connected to the second substrate 310 via a connection member 345. The connection member 345 may pass through a plurality of electrode pads 347 of the semiconductor chips 340 to be connected to a first substrate pad 322 of the second substrate 310. The connection member 345 may here be referred to as a through electrode. The description of the semiconductor chips 240 of FIG. 3A may be referred to with respect to that of the semiconductor chips 340.

The non-volatile memory package 110 may be connected to another package via a connection terminal 117 using a PoP technique. The connection terminal 117 may be formed on a second substrate pad 324 included in the second resin layer 306. Furthermore, the first substrate pad 322 and the second substrate pad 324 may be electrically connected to each other via a circuit included in the second substrate 310.

A molding member 370 may be formed on the second substrate 310 to encapsulate the semiconductor chips 340. For example, the molding member 370 may include an insulation resin, such as an epoxy molding compound.

Figure 3C:
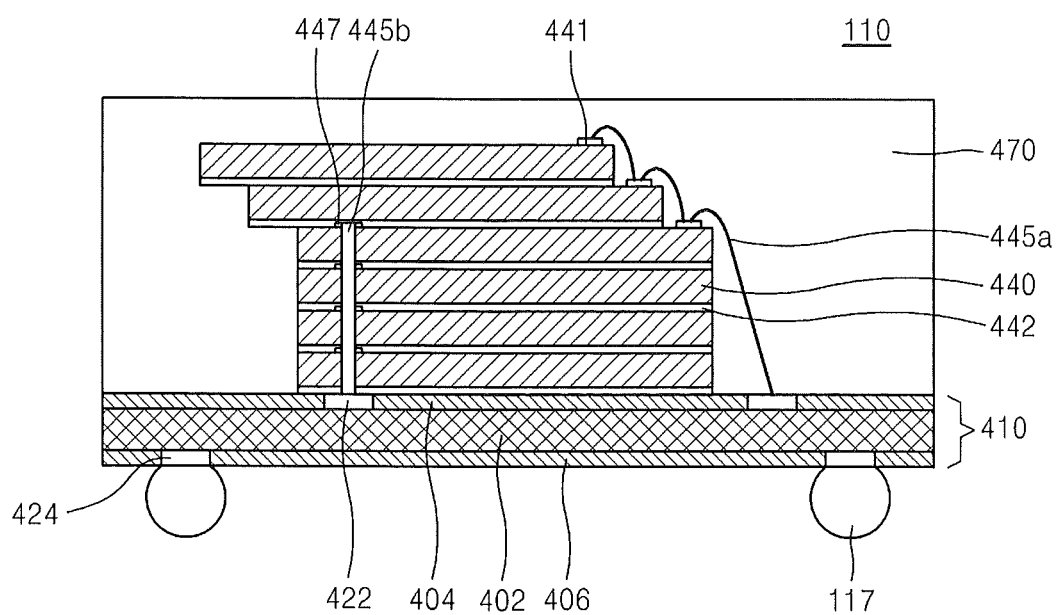

Referring now to FIG. 3C, the non-volatile memory package 110 may include the second substrate 410 and a semiconductor chips 440 stacked on the second substrate 410. The second substrate 410 may include a core board 402 having an upper surface and a lower surface on which a first resin layer 404 and a second resin layer 406 may be formed, respectively. Descriptions of the first resin layer 404, the core board 402, and the second resin layer 406 are not repeated because they are the same as those of the embodiment of FIG. 3A.

The semiconductor chips 440 may be stacked on the second substrate 410 with adhesive members 442 therebetween. Some of the semiconductor chips 440 may be vertically aligned and the rest may be sequentially offset. The semiconductor chips 440 may be electrically connected to the second substrate 410 via a first connection member 445a or a second connection member 445b. The second connection member 445b may pass through a plurality of electrode pads 447 of some of the semiconductor chips 440 to be connected to a first substrate pad 422 of the second substrate 410. The first connection member 445a may electrically connect a plurality of electrode pads 441 of the rest of the semiconductor chips 440 to the second substrate 410. The description of the semiconductor chips 240 of FIG. 3A may be referred to with respect to that of the semiconductor chips 440.

The non-volatile memory package 110 may be connected to another package via a connection terminal 117 in a PoP manner. The connection terminal 117 may be formed on a second substrate pad 424 included in the second resin layer 406. Furthermore, the first substrate pad 422 and the second substrate pad 424 may be electrically connected to each other via a circuit included in the second substrate 410.

A molding member 470 may be formed on the second substrate 410 to encapsulate the semiconductor chips 440. For example, the molding member 470 may include an insulation resin, such as an epoxy molding compound.

Figure 3D:
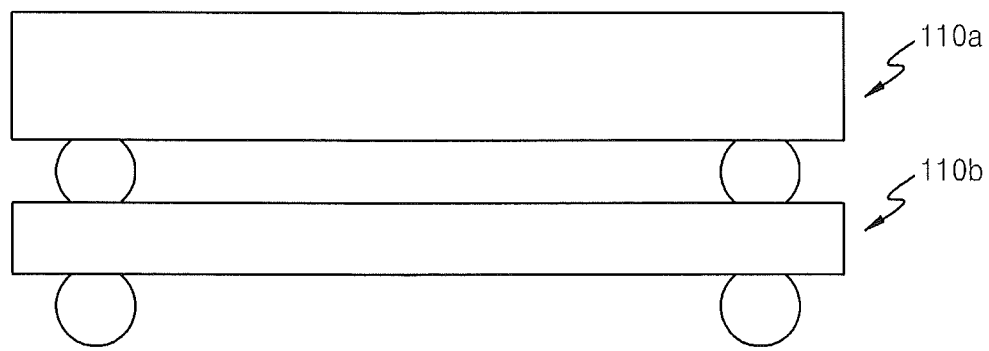

Referring now to FIG. 3D, the non-volatile memory package 110 may include two non-volatile memory packages 110a and 110b. The two non-volatile memory packages 110a and 110b may be coupled to each other using a PoP technique. Each of the two non-volatile memory packages 110a and 110b may independently be any of the non-volatile memory packages 110 illustrated in FIGS. 3A through 3C without departing from the scope of the present inventive concept.

Figure 4A:
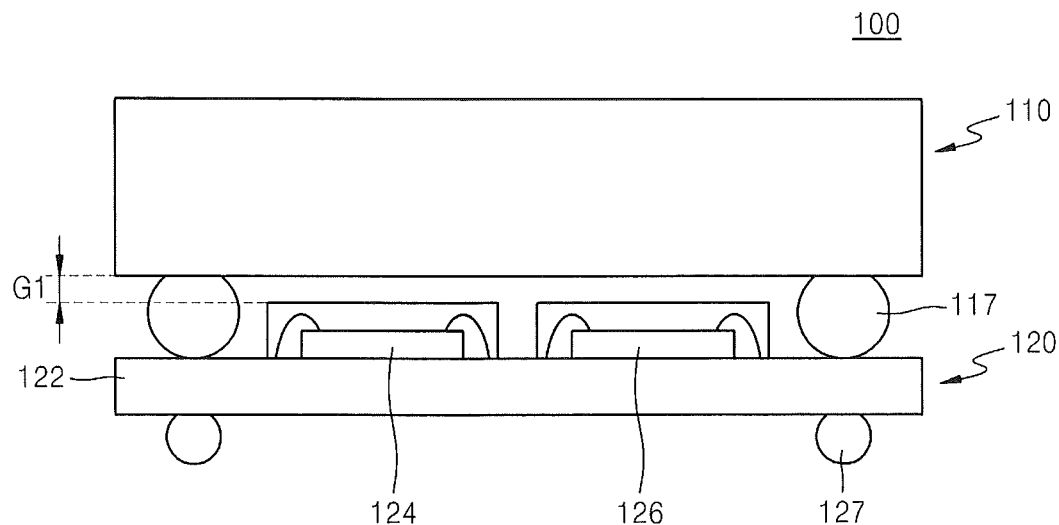
FIGS. 4A and 4B are side cross sections illustrating an SSD package according to some embodiments of the inventive concept.
Figure 4B:
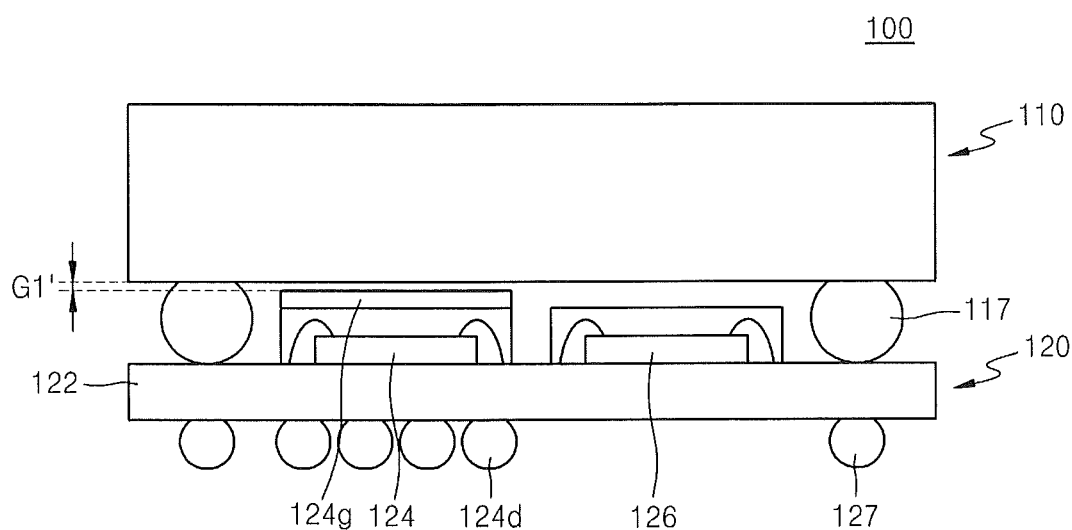

Referring now to FIGS. 4A and 4B, side cross sections illustrating an SSD package 100 in which a non-volatile memory package 110 and a controller package 120 are stacked, according to some embodiments of the inventive concept will be discussed.

As illustrated in FIG. 4A, a space denoted by G1 may be formed between an upper surface of the controller package 120 and a lower surface of the non-volatile memory package 110. Because the space G1 is formed, heat emitted from the controller package 120 may possible be prevented from being transferred to the non-volatile memory package 110 disposed above the controller package 120. A non-volatile memory such as a NAND flash memory is relatively weak to heat, and thus if there is no heat transfer blocking unit as described above, the non-volatile memory may malfunction. In other words, if there is no empty space as described above and the upper surface of the controller package 120 and the lower surface of the non-volatile memory package 110 contact each other, a considerable amount of heat generated by the controller package 120 may be transferred to the non-volatile memory package 110 to cause a malfunction of the non-volatile memory package 110. Accordingly, the space G1 may function as a thermal barrier between the controller package 120 and the non-volatile memory package 110.

Referring now to FIG. 4B, a heat blocking layer 124g may be disposed on the upper surface of the controller package 120. The heat blocking layer 124g may be formed of a material that has a lower thermal conductivity than that of a molding member; for example, the heat blocking layer 124g may be formed of epoxy materials such as polyurethane, aerogel materials, Teflon, Mica, etc. In these embodiments, a space G1' may be unnecessary between the lower surface of the non-volatile memory package 110 and the upper surface of the controller package 120. The heat blocking layer 124g may be formed over a predetermined surface area of the upper surface of the controller package 120. The heat blocking layer 124g may be formed only on an upper surface of an SSD controller chip 124 or on all the upper surface of the controller package 120 except substrate pads.

Optionally, in the controller package 120, a plurality of dummy terminals 124d may be disposed below the SSD controller chip 124 that has high heat generation. Heat generated by the SSD controller chip 124 may be reduced, or possibly eliminated, using a plurality of connection terminals 127 and/or the dummy terminals 124d disposed below the SSD controller chip 124.

A footprint of the controller package 120 and that of the non-volatile memory package 110 may be the same or different. A footprint of the SSD controller chip 124 may be far smaller than that of the semiconductor chips 240, 340, and 440. As a result, the SSD controller chip 124 and the auxiliary memory unit 126 may be arranged on the same level on the first substrate 122 in the controller package 120.

Referring now to FIGS. 5A through 5E, side cross sections illustrating a controller package 120 according to some embodiments of the inventive concept will be discussed. As illustrated in FIGS. 5A through 5E, a first substrate 122 may include, for example, a core board 122a having an upper surface and a lower surface on which a first resin layer 122b and a second resin layer 122c may be respectively formed. A first substrate pad 129a and a second substrate pad 129b for electrical connection to an external device may be disposed on the first resin layer 122b and the second resin layer 122c. Furthermore, a connection terminal 127 for electrical connection to an external device may be disposed on the second substrate pad 129b. An SSD controller chip 124 and an auxiliary memory unit 126 may be mounted on the first resin layer 122b.

Figure 5A:
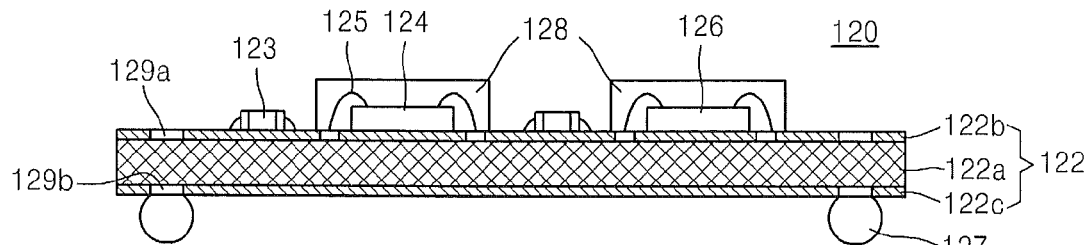
FIGS. 5A through 5E are side cross sections illustrating a controller package according to some embodiments of the inventive concept.

Specifically referring to FIG. 5A, the SSD controller chip 124 and the auxiliary memory unit 126 may be connected to substrate pads formed in the first resin layer 122b via the connection terminals 125. Active surfaces of the SSD controller chip 124 and the auxiliary memory unit 126 may be directed away from the first substrate 122, that is, in an upward direction.

Furthermore, the SSD controller chip 124 and the auxiliary memory unit 126 may each be encapsulated using a molding member 128, which is an insulating material. The molding member 128 may be, for example, an epoxy molding compound. In addition, a passive device 123 may be further mounted on the first resin layer 122b. The passive device 123 may be a condenser, a resistor, or an inductor. The passive device 123 may be electrically connected to the SSD controller chip 124 and/or the auxiliary memory unit 126 via a circuit included in the first substrate 122.

Figure 5B:
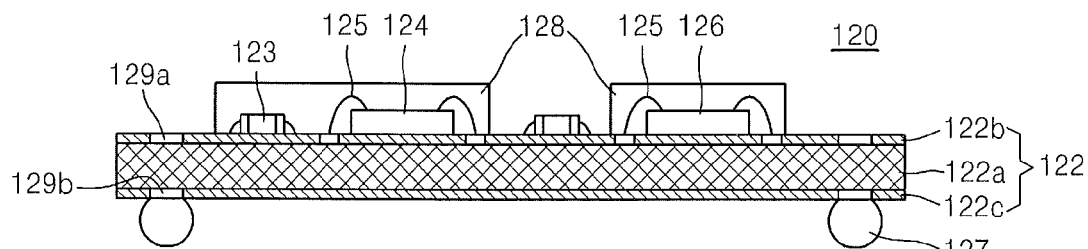

Referring now to FIG. 5B, the SSD controller chip 124 and at least one passive device 123 may be encapsulated using a common molding member 128.

Figure 5C:
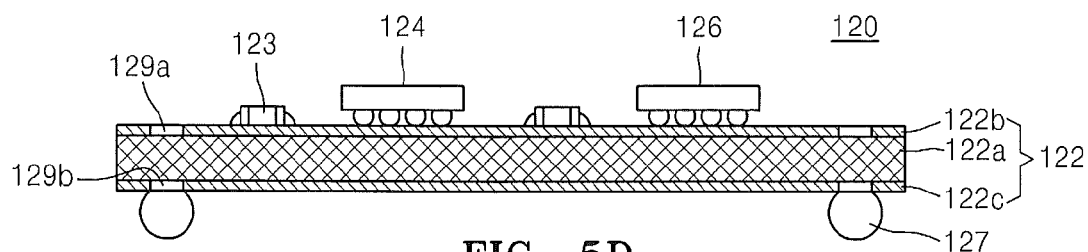

As illustrated in FIG. 5C, the active surfaces of the SSD controller chip 124 and the auxiliary memory unit 126 may be mounted in a flip-chip method to face the first substrate 122.

Figure 5D:
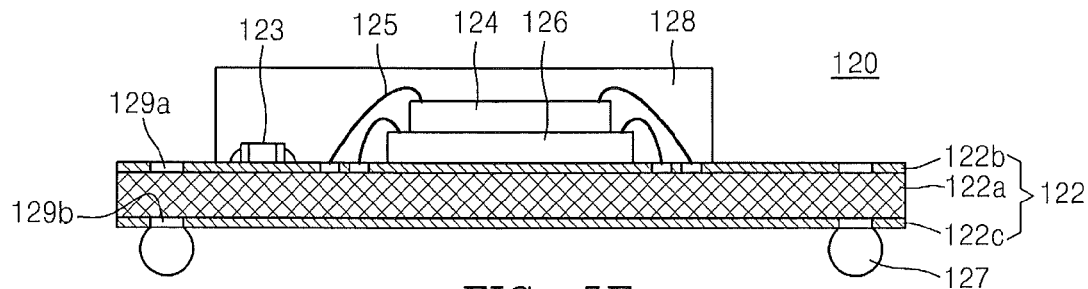

Referring now to FIG. 5D, the SSD controller chip 124 and the auxiliary memory unit 126 may be stacked on each other. That is, the SSD controller chip 124 may be stacked on the auxiliary memory unit 126, and the SSD controller chip 124 and the auxiliary memory unit 126 may each be connected to the first substrate 122 via a connection member 125. Alternatively, the auxiliary memory unit 126 may be disposed on the SSD controller chip 124. Furthermore, at least one passive device 123 may be encapsulated with the SSD controller chip 124 and the auxiliary memory unit 126 using a common molding member 128.

Figure 5E:
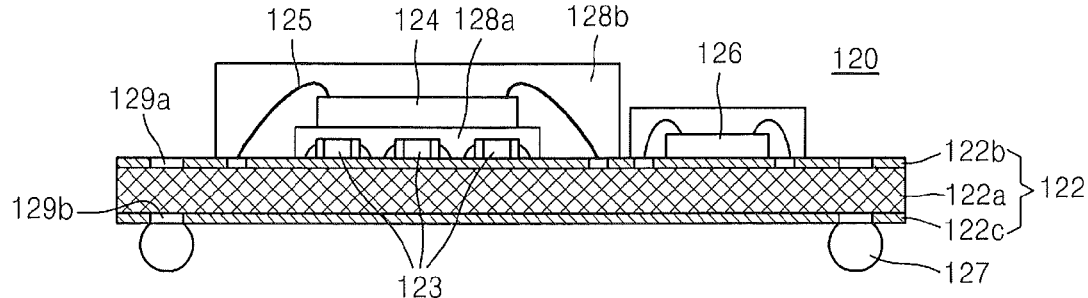

As illustrated in FIG. 5E, the SSD controller chip 124 may be disposed on at least one passive device 123. In other words, the at least one passive device 123 may be encapsulated using a first molding member 128a, and the SSD controller chip 124 may be disposed on the first molding member 128a and may be connected to the first substrate 122 via the connection member 125, and the SSD controller chip 124 may be encapsulated using a second molding member 128b. In this way, a total footprint of the devices in the controller package 120 may be reduced.

While at least one passive device 123 is disposed on the first resin layer 122b in FIGS. 5A through 5E, the at least one passive device 123 may also be disposed on the second resin layer 122c, which is a lower surface of the first substrate 122.

Figure 6:
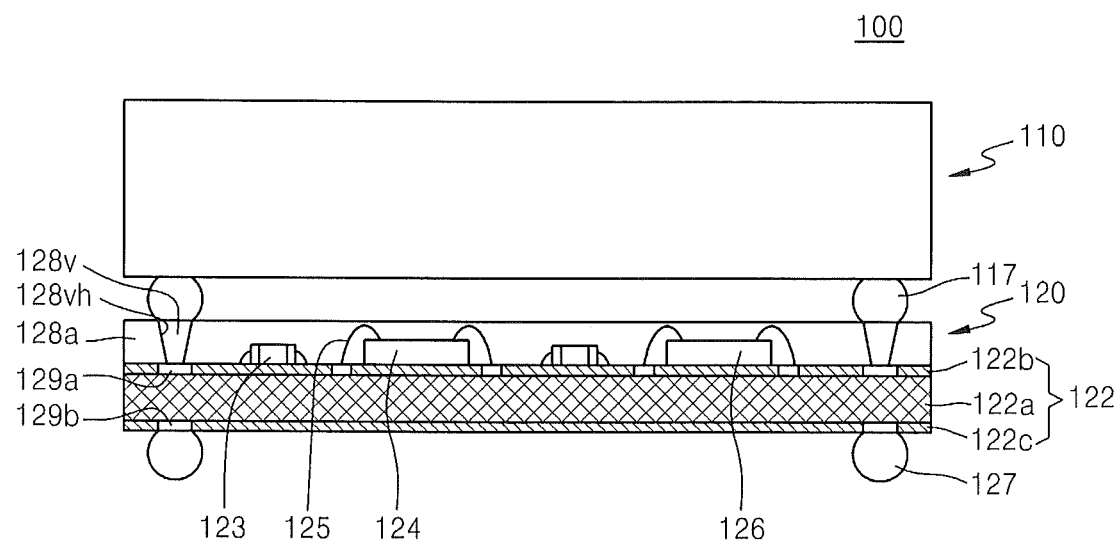
FIGS. 6 through 9 are side cross sections illustrating an SSD package according to some embodiments of the inventive concept.

Referring now to FIG. 6, a side cross-sectional view illustrating an SSD package 100 according to some embodiments of the inventive concept will be discussed. As illustrated in FIG. 6, a non-volatile memory package 110 is stacked on a controller package 120. The controller package 120 may include a through connection terminal (TCT) 128v. The TCT 128v refers to a connection terminal that is formed through an encapsulation material, and may be a via. The TCT 128v includes a laser drilled package (LDP), a through mold via (TMV), or the like. The TCT 128v may be formed to bury a TCT via-hole 128vh formed in a molding member 128a that encapsulates an SSD controller chip 124. A connection terminal 117 that electrically connects the non-volatile memory package 110 and the controller package 120 may be formed to be electrically connected to the TCT 128v.

Figure 7:
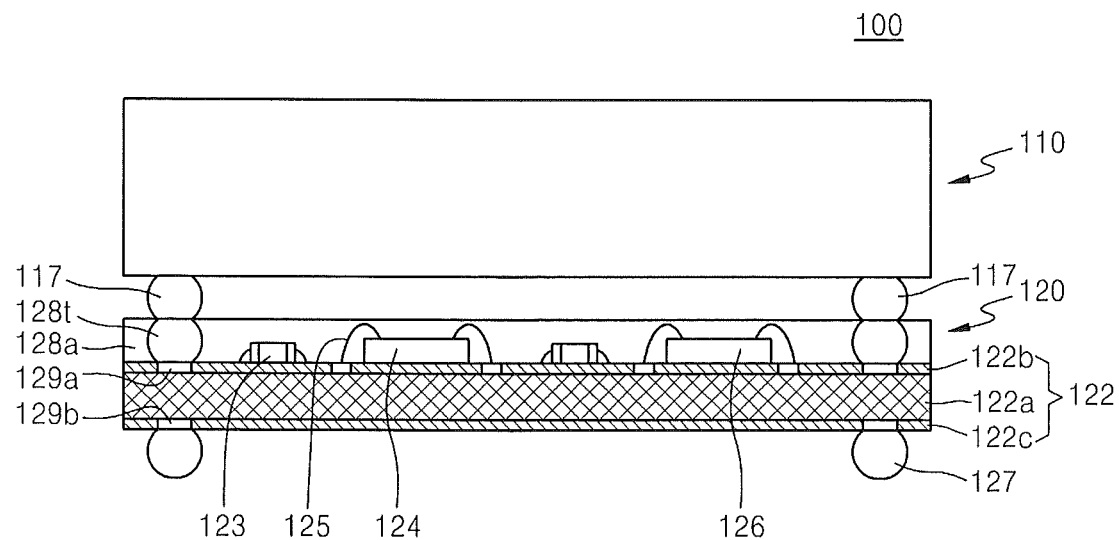

Referring now to FIG. 7, a side cross-sectional view illustrating an SSD package 100 according to some embodiments of the inventive concept will be discussed. As illustrated in FIG. 7, a non-volatile memory package 110 is stacked on a controller package 120, and the controller package 120 includes a conductive terminal 128t that may be connected to a connection terminal 117. The conductive terminal 128t may be a bump or a solder ball but is not limited thereto. The conductive terminal 128t may be disposed inside a molding member 128a that encapsulates an SSD controller chip 124. The conductive terminal 128t may be disposed such that an upper surface thereof is exposed from the molding member 128a.

Figure 8A:
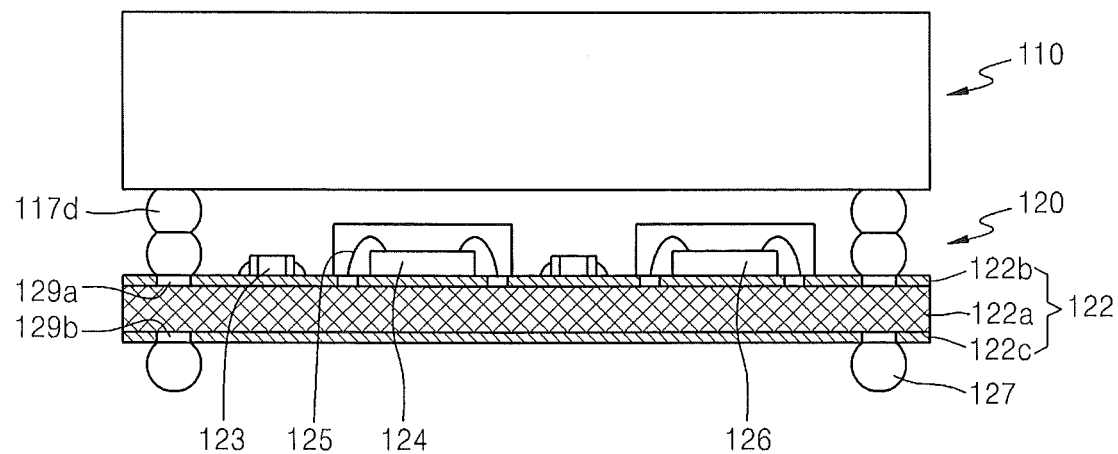
Figure 8B:
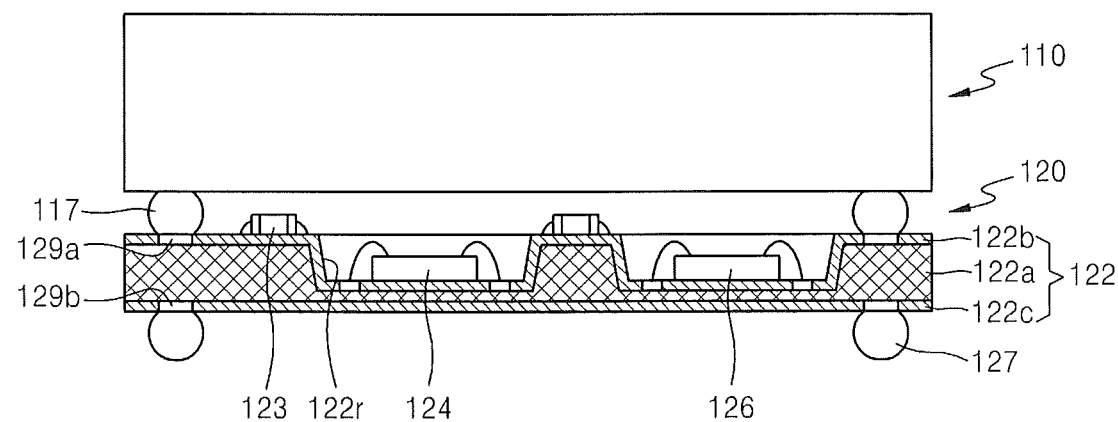

FIGS. 8A and 8B are side cross sections illustrating an SSD package 100 according to some embodiments of the present inventive concept. As illustrated in FIG. 8A, a non-volatile memory package 110 is stacked on a controller package 120, and the controller package 120 and the non-volatile memory package 110 are electrically connected to each other via a connection terminal 117d. The connection terminal 117d may be formed of solder balls that are disposed on each other. The solder balls disposed on each other may be partially melted, reflown, and then re-coagulated to substantially have a circular cross-section at a contact portion.

By using the connection terminal 117d formed of the solder balls disposed on each other, as illustrated in FIG. 8A, a small pitch of the connection terminal 117d may be maintained even if a mounted height of the SSD controller chip 124 is high.

Referring to FIG. 8B, in order to reduce a height of the SSD package 100, a recess 122r may be formed in the first substrate 122, and the SSD controller chip 124 may be accommodated inside the recess 122r.

Figure 9:
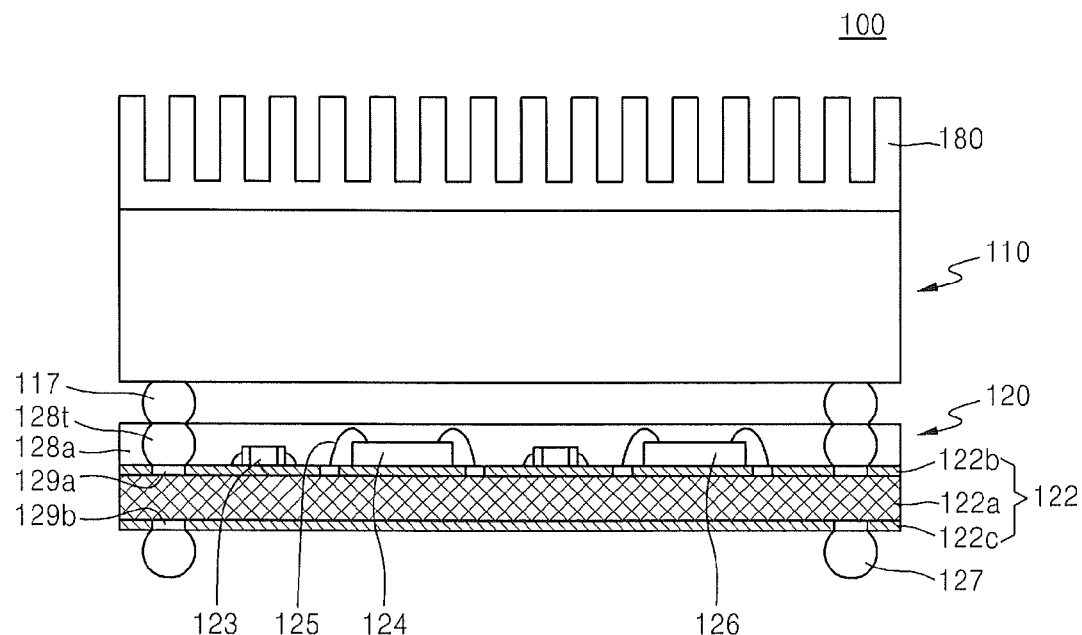

Referring to FIG. 9, a side cross-sectional view illustrating an SSD package 100 according to some embodiments of the inventive concept will be discussed. As illustrated in FIG. 9, a heat sink 180 may be further disposed on the non-volatile memory package 110. The heat sink 180 may be a water-cooling type heat sink or an air-cooling type heat sink. The heat sink 180 may include a plurality of fins to increase a heat elimination efficiency of the heat sink 180.

Figure 10:
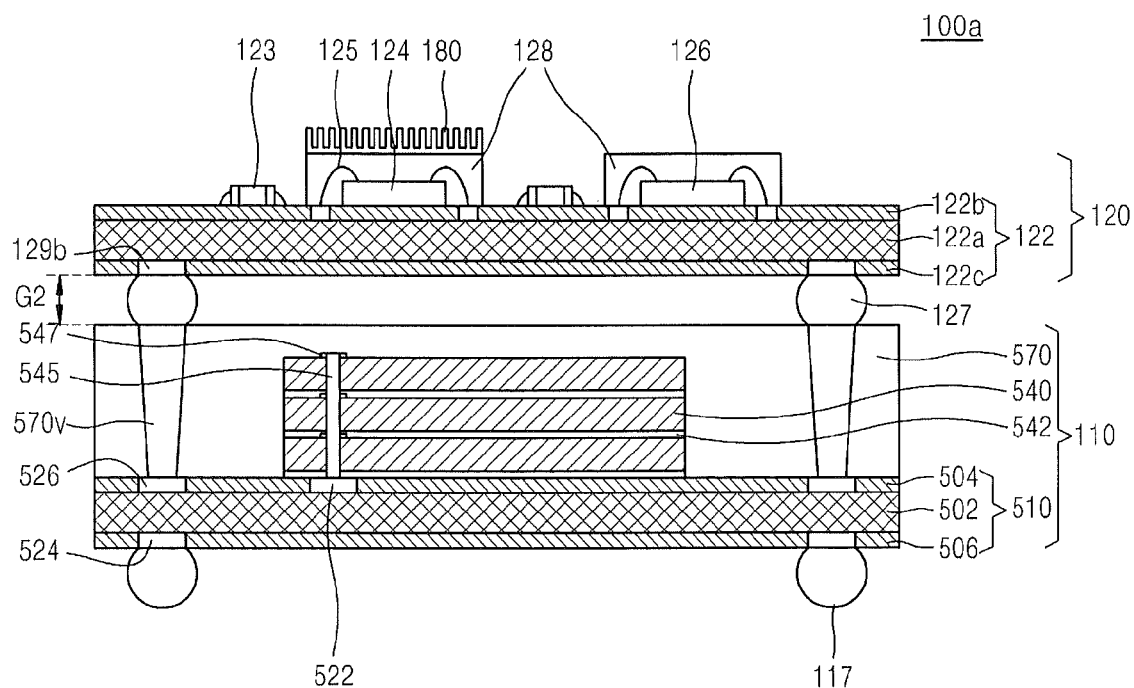
FIG. 10 is a schematic cross section of a package-on-package (PoP) type SSD package in which a controller package is stacked on a non-volatile memory package according to some embodiments of the inventive concept.

While a PoP type SSD package in which the non-volatile memory package 110 is stacked on the controller package 120 has been described above, the inventive concept is not limited thereto; a PoP type SSD package in which the controller package 120 is stacked on the non-volatile memory package 110 may also be formed. FIG. 10 is a schematic cross-sectional view of an SSD package 100a formed in a PoP form in which a controller package 120 is stacked on a non-volatile memory package 110, according to some embodiments of the inventive concept.

Referring now to FIG. 10, the controller package 120 and the non-volatile memory package 110 may be stacked on each other using a PoP technique. The non-volatile memory package 110 may include the second substrate 510 and semiconductor chips 540 stacked on the second substrate 510.

The second substrate 510 may include a core board 502 having an upper surface and a lower surface on which a first resin layer 504 and a second resin layer 506 may be formed, respectively. Descriptions of the first resin layer 504, the core board 502, and the second resin layer 506 are not repeated because they are similar to embodiments illustrated in FIG. 3A.

The semiconductor chips 540 may be stacked on the second substrate 510 with adhesive members 542 therebetween. While the semiconductor chips 540 discussed with respect to FIG. 10 are stacked without being offset, all the semiconductor chips 540 may be offset or some of them may be offset. The semiconductor chips 540 may be electrically connected to the second substrate 510 via a connection member 545. The connection member 545 may pass through a plurality of electrode pads 547 of the semiconductor chips 540 to be connected to a first substrate pad 522 of the second substrate 510. The connection member 545 here may be referred to as a through electrode. The description of the semiconductor chips 240 of FIG. 3A may be referred to with respect to that of the semiconductor chips 540.

A molding member 570 may be formed on the second substrate 510 to encapsulate the semiconductor chips 540. For example, the molding member 570 may include an insulation resin such as an epoxy molding compound.

The non-volatile memory package 110 may be directly connected to a main board (not shown) via a connection terminal 117. The connection terminal 117 may be formed on a second substrate pad 524 provided in the second resin layer 506. Furthermore, the first substrate pad 522 and the second substrate pad 524 may be electrically connected to each other via a circuit included in the second substrate 510.

The controller package 120 may include a first substrate 122 and an SSD controller chip 124 that is mounted on the first substrate 122. The first substrate 122 may include, for example, a core board 122a having an upper surface and a lower surface on which a first resin layer 122b and a second resin layer 122c may be formed, respectively. A second substrate pad 129b for electrical connection to an external device may be included in the second resin layer 122c. Furthermore, a connection terminal 127 for electrical connection to the non-volatile memory package 110 may be formed on the second substrate pad 129b to be disposed below the second substrate pad 129b. A TCT 570v for electrical connection with the connection terminal 127 may be formed in the molding member 570. The TCT 570v may be connected to a third substrate pad 526. The third substrate pad 526 may be electrically connected to the first substrate pad 522 and/or the second substrate pad 524 via a circuit included in the second substrate 510.

A heat sink 180 may be further formed on the controller package 120. The heat sink 180 may be a water cooling-type heat sink or an air-cooling type heat sink. The heat sink 180 may include a plurality of fins to increase a heat elimination efficiency of the heat sink 180.

Furthermore, a space denoted by G2 may be formed between an upper surface of the non-volatile memory package 110 and a lower surface of the controller package 120. Because the space G2 is formed, heat emitted from the non-volatile memory package 110 may possibly be prevented from being transferred to the controller package 120 disposed above the non-volatile memory package 110. If there is no empty space as described above and the upper surface of the non-volatile memory package 110 and the lower surface of the controller package 120 contact each other, a considerable amount of heat generated by the non-volatile memory package 110 is transmitted to the controller package 120 to cause a malfunction of the controller package 120.

Among the connection terminal 127 of the first substrate 122 or the connection terminal 117 of the second substrates 210, 310, 410, and 510, the connection terminal 117, and 127 of the substrate that is disposed lowermost may be a conductive bump, a pin, a lead line, etc. as discussed above. In addition, a cable connection terminal which may be connected to an input/output cable may not be formed or installed in the substrate disposed lower between the first substrate 122 and the second substrate 510.

Figure 11:
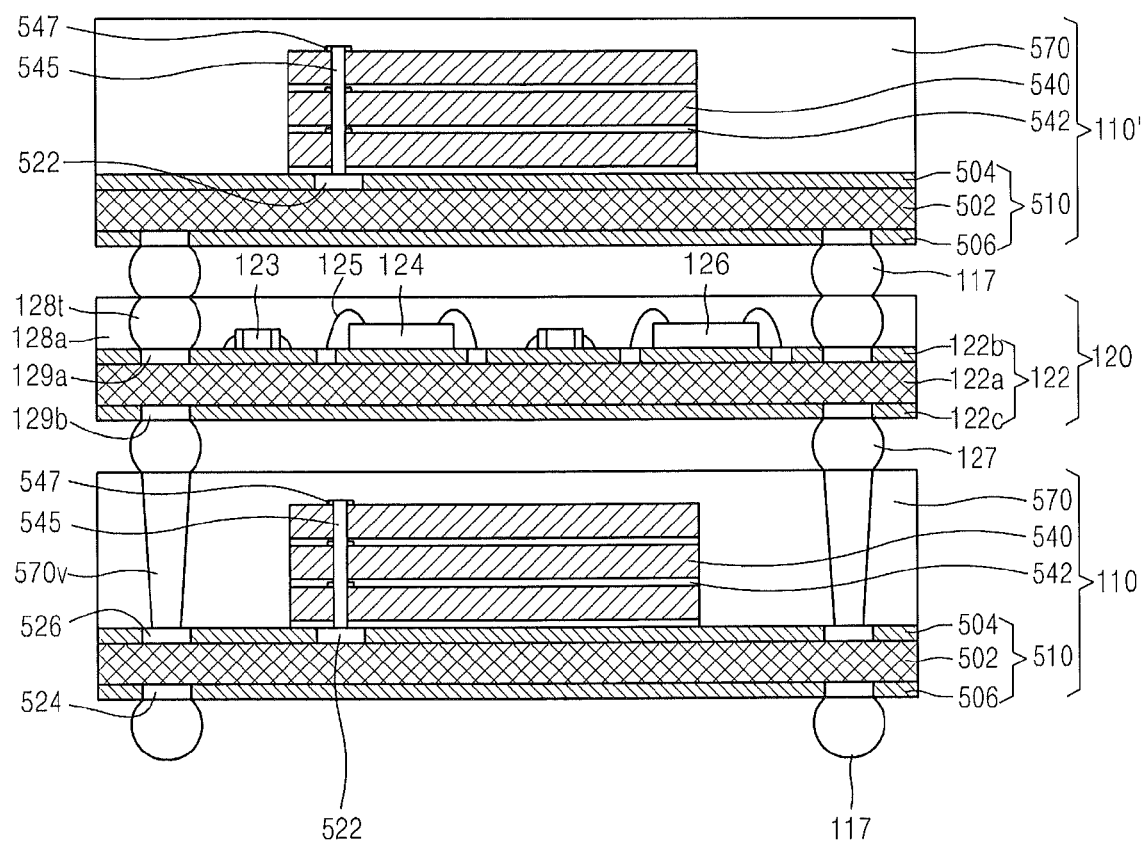
FIG. 11 is a side cross section illustrating a stack of SSD packages according to some embodiments of the inventive concept.

Referring now to FIG. 11, a side cross-sectional view illustrating an SSD package stack 100b according to some embodiments of the inventive concept will be discussed. As illustrated in FIG. 11, a controller package 120 may be stacked on a first non-volatile memory package 110. Furthermore, a second non-volatile memory package 110' may be stacked on the controller package 120. In these embodiments, the first non-volatile memory package 110 and the second non-volatile memory package 110' may be symmetrically arranged about the controller package 120. Consequently, a distance from the controller package 120 to the first non-volatile memory package 110 and the second non-volatile memory package 110' is substantially identical, and thus better operating characteristics of the SSD package stack 100b may be obtained.

Figure 12:
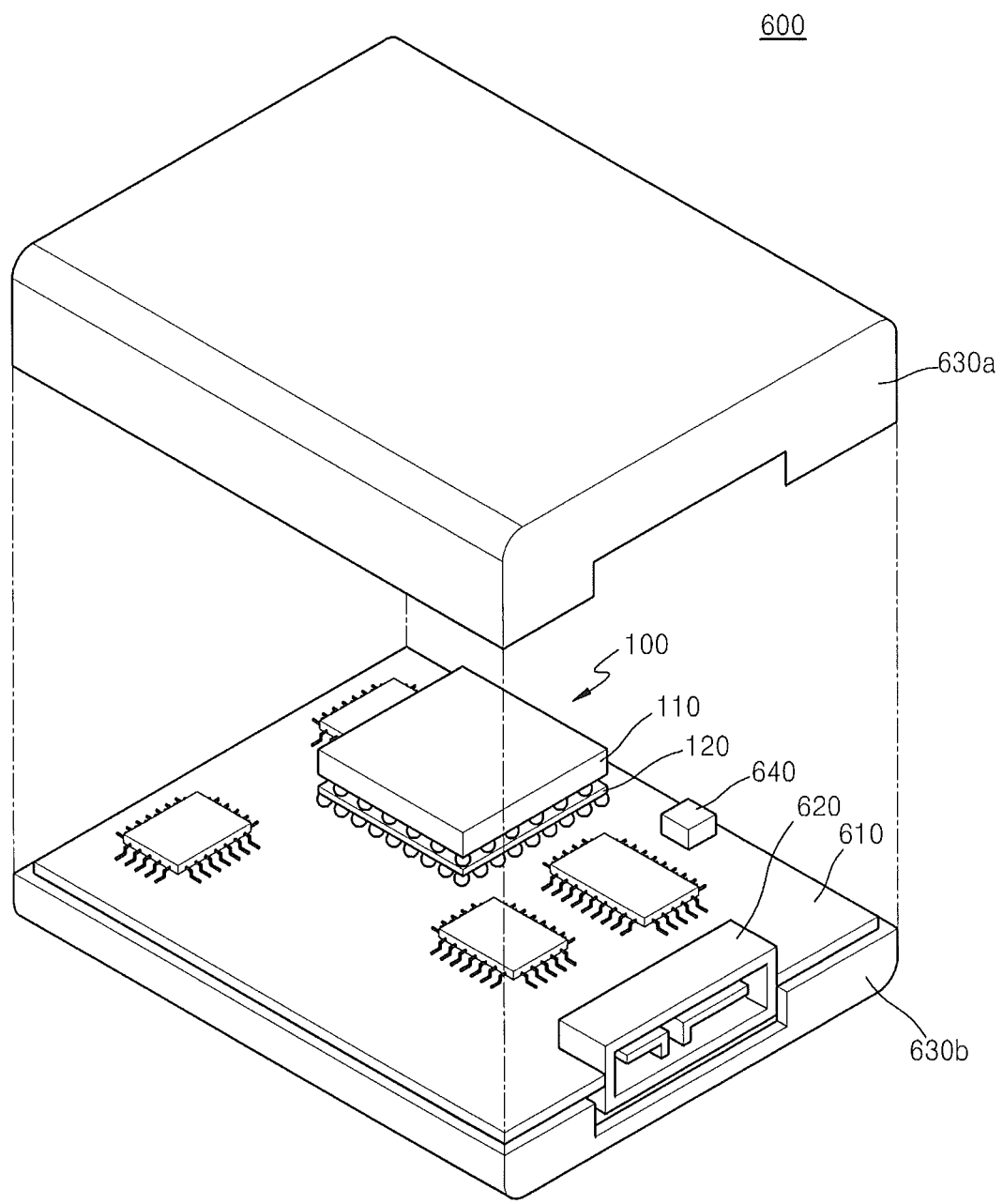
FIG. 12 is an exploded perspective view illustrating a data storage system according to some embodiments of the inventive concept.

Referring now to FIG. 12, an exploded perspective view illustrating a data storage system 600 according to some embodiments of the inventive concept will be discussed. As illustrated in FIG. 12, the data storage system 600 includes a main board 610 and an SSD package 100 directly mounted on the main board 610. The SSD package 100 may be electrically connected to an input/output terminal 620 via a wiring formed on the main board 610. Furthermore, the data storage system 600 may further include a power terminal 640 to supply power to the main board 610. The main board 610 may be provided inside cases 630a and 630b.

The input/output terminal 620 may form an interface between the data storage system 600 and an external device. The input/output terminal 620 may be formed according to SATA standards, PATA standards, or SCSI standards. The SATA standard includes all types of SATA standards, that is, not only SATA-1 but also SATA-2, SATA-3, or e-SATA. The PATA standard includes all IDE standards such as IDE and E-IDE.

The data storage system 600 may be, for example, a portable data storage system, a network attached storage (NAS), etc. The NAS may be a system that inputs or outputs data via a local area network (LAN) such as Ethernet or TCP/IP or a wide area network (WAN) and is capable of storing a large amount of data. The input/output terminal 620 may be a terminal that may accommodate an input/output cable according to a network standard as described above.

Figure 13:
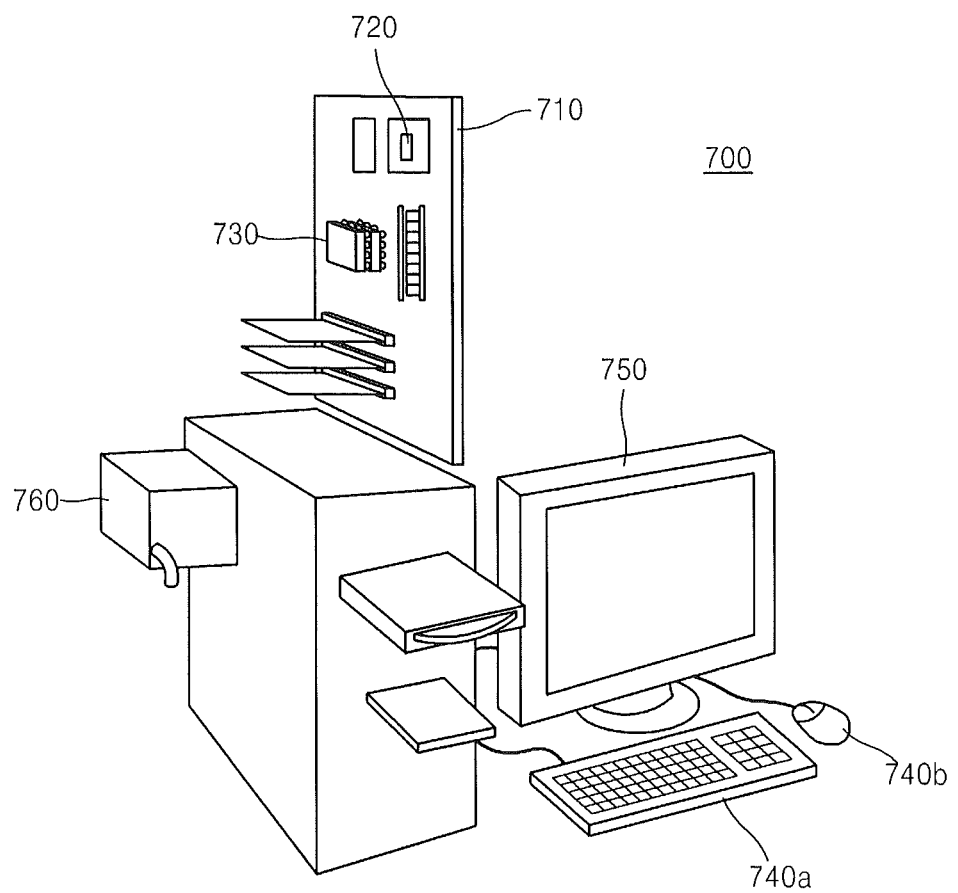
FIG. 13 is a conceptual diagram of a system according to some embodiments of the inventive concept.

Referring now to FIG. 13, a conceptual diagram of a system 700 according to some embodiments of the inventive concept will be discussed. As illustrated in FIG. 13, the system 700 may include a main board 710, a central processing unit 720 mounted on the main board 710, an SSD package 730, input units 740a and 740b, and an output unit 750. The SSD package 730 may be one of the SSD packages 100, 100a, and 100b described above.

The input units 740a and 740b may be a keyboard, a mouse, a touch screen, etc. but are not limited thereto. The input units 740a and 740b may be a device through which data may be input to the central processing unit 720. The output unit 750 may be a monitor or a printer, but is not limited thereto. The output unit 750 may be a device through which data may be output from the central processing unit 720. The input units 740a and 740b and the output unit 750 may also be integrated as a single device.

The SSD package 730 may be directly mounted on the main board 710. Optionally, the SSD package 730 may be mounted on the main board 710 via a solder ball. The SSD package 730 may communicate with the central processing unit 720 via conductive patterns (not shown) formed on the main board 710 according to the SATA standard. A power supply unit 760 may be installed in the system 700 to supply power to the main board 710, etc.

The system 700 may be an electronic system and may be, for example, a desktop personal computer, a laptop personal computer, a smartphone, a tablet, a portable multimedia player (PMP), a navigation system, or a flat panel display television.

Figure 14:
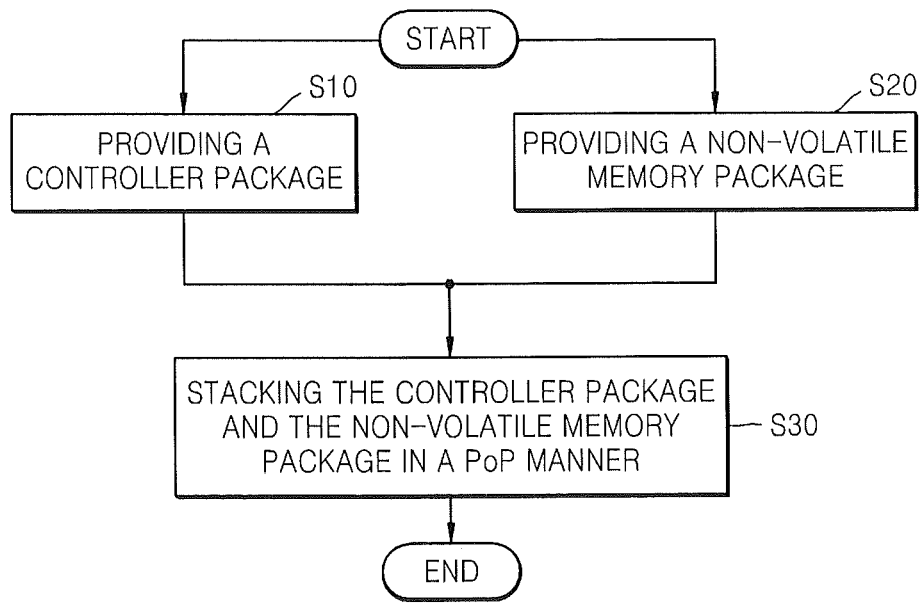
FIG. 14 is a flowchart illustrating processing steps in the fabrication of an SSD package according to some embodiments of the inventive concept.

Referring now to FIG. 14, processing steps in the fabrication of an SSD package according to some embodiments of the inventive concept will now be discussed. As illustrated in FIG. 14, the method includes operation S10 in which a controller package including an SSD controller chip mounted on a first substrate is provided, operation S20 in which a non-volatile memory package including semiconductor chips mounted on a second substrate is provided, and operation S30 in which the controller package and the non-volatile memory package are stacked using a PoP technique to provide an SSD package.

Operation S10 of providing the controller package and operation S20 of providing the non-volatile memory package may be performed separately. Alternatively, one of operation 510 and operation S20 may be performed prior to the other. Alternatively, operation S10 and operation S20 may be performed simultaneously.

Figure 15A:
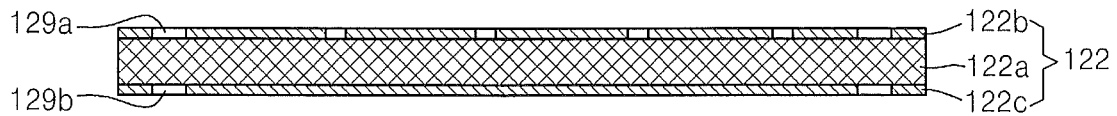
FIGS. 15A through 15D are side cross sections illustrating a process of providing a controller package according to some embodiments of the inventive concept.
Figure 15B:
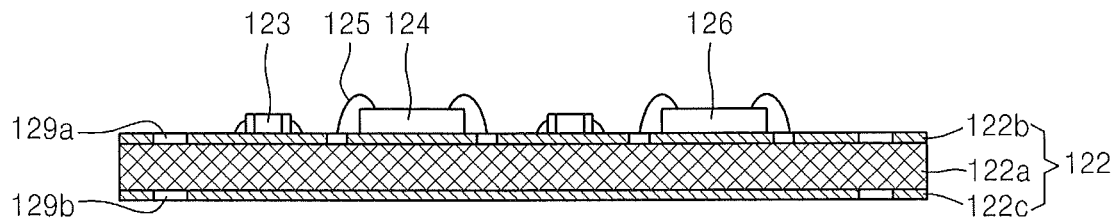
Figure 15C:
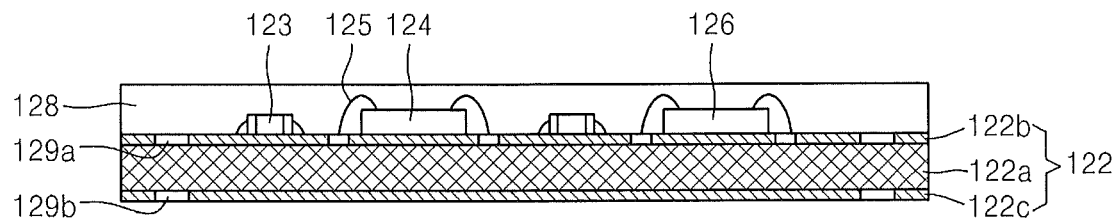
Figure 15D:
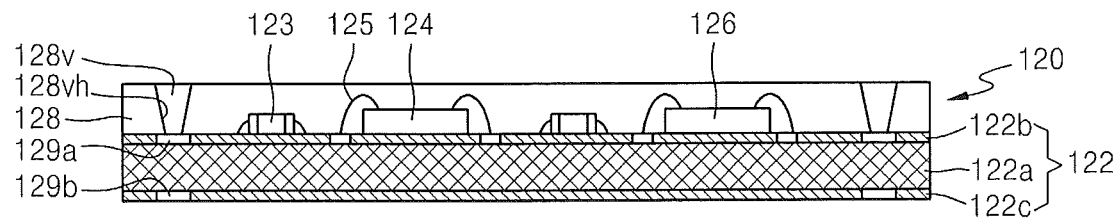
Figure 16A:
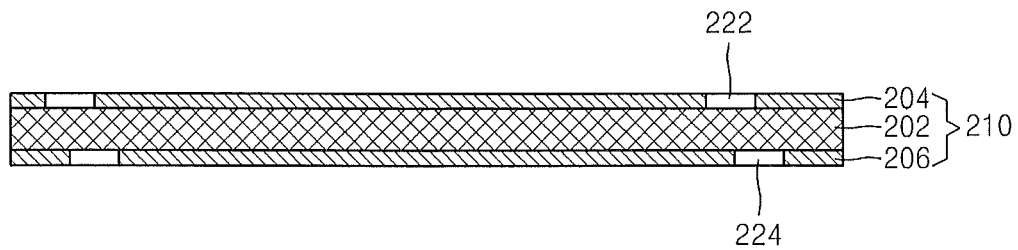
FIGS. 16A through 16C are side cross sections illustrating a process of providing a non-volatile memory package according to some embodiments of the inventive concept.
Figure 16B:
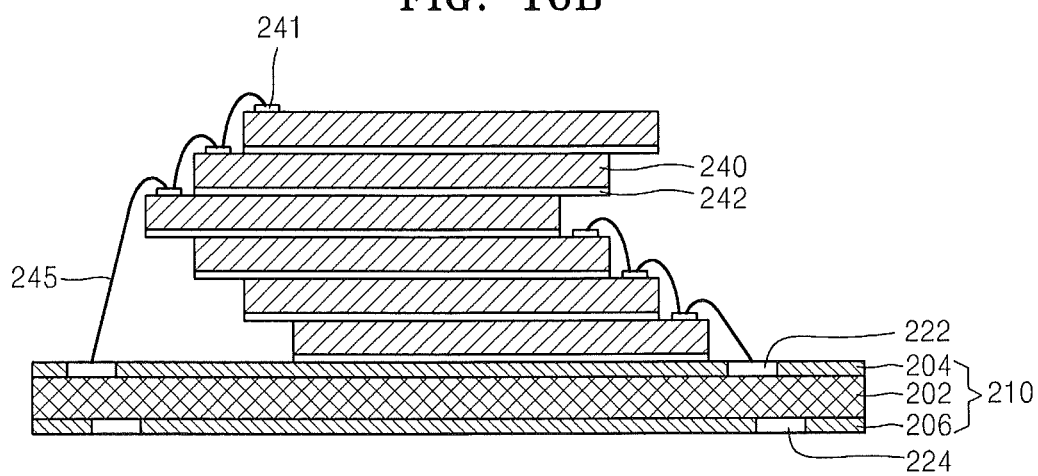
Figure 16C:
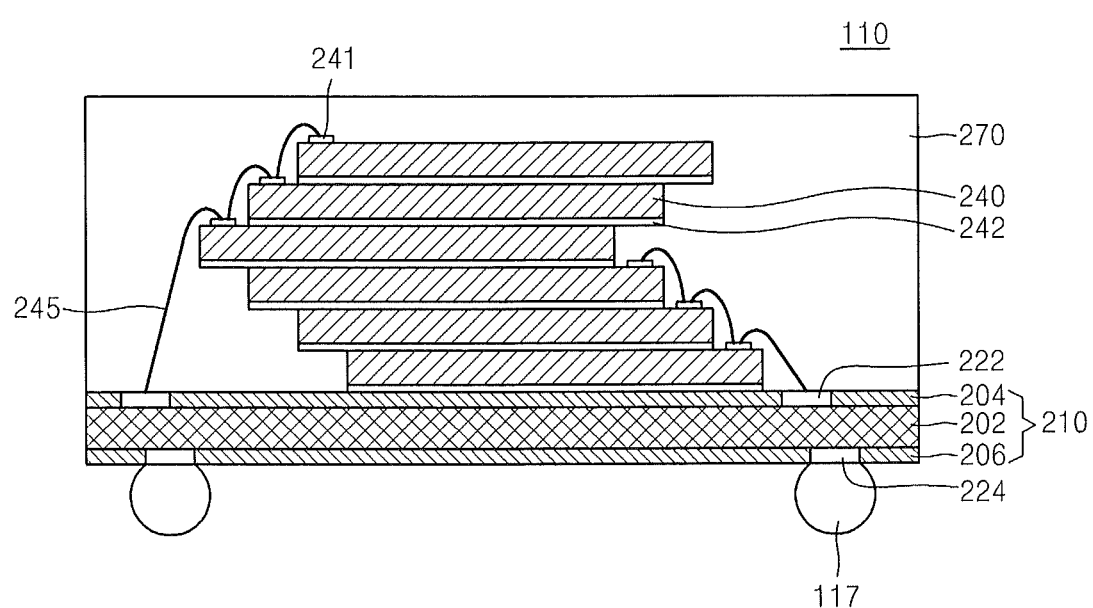

Referring now to FIGS. 15A through 15D and FIGS. 16A through 16C, operations according to some embodiments of the present inventive concept will be discussed. FIGS. 15A through 15D are side cross sections illustrating operation S10 in which the controller package is provided. FIGS. 16A through 16C are side cross sections illustrating operation S20 in which the non-volatile memory package is provided.

Referring first to FIG. 15A, a first substrate 122 is provided. Details of the first substrate 122 have been discussed above with respect to FIGS. 5A to 5E and, therefore, in the interest of brevity will not be repeated herein. As illustrated in FIG. 15B, an SSD controller chip 124, a passive device 123, and/or an auxiliary memory unit 126 are mounted on the first substrate 122. As described above, the mounting method may be a BGA method, a PGA method, a TCP method, a COB method, a QFN method, or a QFP method, but is not limited thereto. According to some embodiments of the inventive concept, the SSD controller chip 124 is attached on the first substrate 122 using an adhesive member, and is electrically connected to the first substrate 122 via a connection member 125 such as a bonding wire.

Referring now to FIG. 15C, the SSD controller chip 124, the passive device 123, and the auxiliary memory unit 126 are all encapsulated using a molding member 128. Then, referring to FIG. 15D, a TCT via-hole 128vh is formed to expose a first substrate pad 129a of the first substrate 122, and then the TCT via-hole 128vh may be filled with a conductive material to form a TCT 128v.

Referring now to FIG. 16A, a second substrate 210 is provided. Details with respect to the second substrate 210 have been discussed above with respect to FIG. 3A and, therefore, in the interest of brevity will not be repeated herein. As illustrated in FIG. 16B, at least one semiconductor chip 240 is mounted on the second substrate 210. As described above, the semiconductor chip 240 may be a memory chip. While a plurality of semiconductor chips 240 are mounted in FIG. 16B, only a single semiconductor chip 240 may also be mounted. In addition, while the semiconductor chips 240 are stacked offset in predetermined directions, the semiconductor chips 240 may also be aligned vertically parallel. In these embodiments, each of the semiconductor chips 240 may be electrically connected to one another via a through-silicon via (TSV).

The semiconductor chips 240 may be electrically connected to the second substrate 210 and to each other via a connection member 245 such as a bonding wire.

Referring now to FIG. 16C, the semiconductor chips 240 may be encapsulated using a molding member 270. Furthermore, a connection terminal 117 may be formed on a second substrate pad 224 formed in a second resin layer 206 of the second substrate 210.

Figure 17:
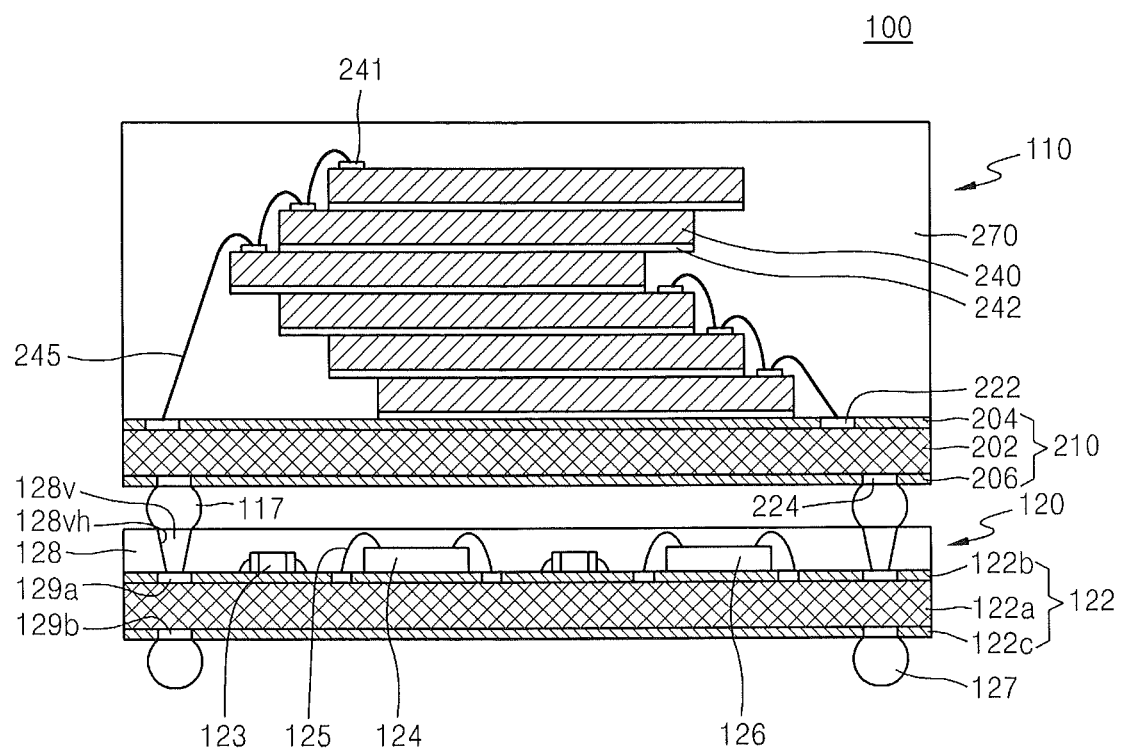
FIG. 17 is a cross section illustrating a process of stacking the non-volatile memory package and the controller package in a package-on-package manner to form an SSD package according to some embodiments of the inventive concept.

Referring now to FIG. 17, a conceptual diagram illustrating a non-volatile memory package 110 and a controller package 120 that are stacked using a PoP technique to form an SSD package 100 according to some embodiments of the inventive concept will be discussed. As illustrated in FIG. 17, the non-volatile memory package 110 to which a connection terminal 117 is attached is stacked on the controller package 120, that is, on a TCT 128v of the controller package 120, and then heat and/or a pressure is applied to the non-volatile memory package 110 and the controller package 120 so that the connection terminal 117 and the TCT 128v are electrically connected to each other.

Then, a connection terminal 127 may be formed on a second substrate pad 129b formed in a second resin layer 122c of a first substrate 122.

While the non-volatile memory package 110 is stacked on the controller package 120, it will be obvious to one of ordinary skill in the art to stack the controller package 120 on the non-volatile memory package in the same manner as described above.

While the inventive concept has been particularly shown and described with reference to exemplary embodiments thereof, it will be understood that various changes in form and details may be made therein without departing from the spirit and scope of the following claims.

What is claimed is:

1. A solid state drive (SSD) package comprising a controller package and at least one non-volatile memory package,
   wherein the controller package and the at least one non-volatile memory package are connected to each other using a package-on-package (PoP) technique;
   wherein a data input/output of the at least one non-volatile memory package is controlled by using the controller package; and
   wherein the at least one non-volatile memory package is disposed on the controller package such that there is a space between at least a portion of an upper surface of the controller package and the non-volatile memory package.

2. The SSD package of claim 1:
   wherein the controller package comprises an SSD controller chip; and
   wherein the SSD controller chip comprises a program that transmits or receives a signal to or from an external device according to the Serial Advanced Technology Attachment (SATA) standard.

3. The SSD package of claim 2, wherein the SSD controller chip comprises an auxiliary memory unit and the auxiliary memory unit comprises a dynamic random access memory (DRAM).

4. The SSD package of claim 2, wherein the controller package further comprises:
   a first substrate on which the SSD controller chip is mounted, wherein the at least one non-volatile memory package disposed on the controller package is connected to the first substrate via a connection terminal.

5. The SSD package of claim 4, wherein the controller package further comprises an auxiliary memory unit, wherein the controller package communicates with an external system via the auxiliary memory unit.

6. The SSD package of claim 5, wherein the auxiliary memory unit is disposed at substantially the same height as the SSD controller chip and is connected to the non-volatile memory package using a PoP technique.

7. The SSD package of claim 5, wherein the auxiliary memory unit comprises a dynamic random access memory (DRAM).

8. The SSD package of claim 4, further comprising a passive device mounted on the first substrate, wherein the passive device is electrically connected to the SSD controller chip.

9. The SSD package of claim 4, wherein the non-volatile memory package is connected to the first substrate via a through connection terminal (TCT).

10. The SSD package of claim 4, wherein the first substrate is connected to an external device via a conductive bump.

11. The SSD package of claim 1, further comprising a heat sink on the non-volatile memory package.

12. A solid state drive (SSD) package comprising a controller package and at least one non-volatile memory package,
    wherein the controller package and the at least one non-volatile memory package are connected to each other using a package-on-package (PoP) technique;
    wherein a data input/output of the at least one non-volatile memory package is controlled by using the controller package;
    wherein the controller package is disposed on the at least one non-volatile memory package;
    wherein the non-volatile memory package comprises a non-volatile memory chip and a second substrate on which the non-volatile memory chip is mounted; and
    wherein the controller package disposed on the non-volatile memory package is connected to the second substrate via a connection terminal.

13. The SSD package of claim 12, wherein the second substrate is connected to an external device via a conductive bump.

14. The SSD package of claim 12, further comprising an additional non-volatile memory package disposed on the controller package.

15. A data storage system comprising:
    a main board;
    a solid state drive (SSD) package mounted on the main board, the SSD package comprising:
      a controller package; and
      at least one non-volatile memory package,
        wherein the controller package and the at least one non-volatile memory package are connected to each other using a package-on-package (PoP) technique;
        wherein the at least one non-volatile memory package is disposed on the controller package such that there is a space between at least a portion of an upper surface of the controller package and the non-volatile memory package; and
        wherein a data input/output of the at least one non-volatile memory package is controlled by using the controller package; and
    an input/output terminal that is electrically connected to the SSD package via the main board and forms an interface between the SSD package and an external device.

16. The data storage system of claim 15, wherein the SSD package is mounted on the main board via a conductive bump.

17. A system comprising:
    a main board;
    a central processing unit mounted on the main board;
    a solid state drive (SSD) package mounted on the main board and configured to communicate with the central processing unit using the SATA standard, the SSD package comprising:
      a controller package; and
      at least one non-volatile memory package,
        wherein the controller package and the at least one non-volatile memory package are connected to each other using a package-on-package (PoP) technique;
        wherein the at least one non-volatile memory package is disposed on the controller package such that there is a space between at least a portion of an upper surface of the controller package and the non-volatile memory package; and
        wherein a data input/output of the at least one non-volatile memory package is controlled by using the controller package;
    an input unit for inputting data to the central processing unit; and
    an output unit for outputting data from the central processing unit.

18. The system of claim 17, wherein the SSD package is mounted on the main board via a conductive bump.

* * * * *